US008319556B2

(12) United States Patent  
Comeau et al.

(10) Patent No.: US 8,319,556 B2  
(45) Date of Patent: Nov. 27, 2012

(54) TRANSFORMER COUPLED DISTRIBUTED AMPLIFIER

(75) Inventors: Jonathan P. Comeau, Winchester, MA (US); Matthew A. Morton, Reading, MA (US); Edward W. Thoenes, Cambridge, MA (US)

(73) Assignee: Raytheon Company, Waltham, MA (US)

( * ) Notice: Subject to any disclaimer, the term of this patent is extended or adjusted under 35 U.S.C. 154(b) by 3 days.

(21) Appl. No.: 12/942,467

(22) Filed: Nov. 9, 2010

(65) Prior Publication Data

US 2012/0112835 A1 May 10, 2012

(51) Int. Cl.
*H03F 3/60* (2006.01)
(52) U.S. Cl. ........................ 330/286; 330/276
(58) Field of Classification Search .................. 330/53, 330/54, 124 R, 286, 295, 188, 195, 276
See application file for complete search history.

(56) References Cited

U.S. PATENT DOCUMENTS

| 7,068,104 | B2 * | 6/2006 | Burns et al. ..................... 330/253 |
| 7,075,371 | B2 * | 7/2006 | Aoki et al. ...................... 330/276 |
| 8,049,564 | B2 * | 11/2011 | Pallotta ........................ 330/276 |
| 2006/0006950 | A1 | 1/2006 | Burns et al. | |
| 2007/0046371 | A1 | 3/2007 | Barabash et al. | |
| 2007/0152751 | A1 * | 7/2007 | Do et al. ....................... 330/165 |

FOREIGN PATENT DOCUMENTS

WO    WO 2007/044595 A2    4/2007

OTHER PUBLICATIONS

Niknejad et al., "Integrated Circuit Transmission-Line Transformer Power Combiner for Millimetre-Wave Applications", Electronics Letters, Mar. 1, 2007, vol. 43, No. 5, 2 pages.
Li et al., "A Planar Compatible Traveling-Wave Waveguide-Based Powr Divider/Combiner", IEEE Transactions on Microwave Theory and Techniques, vol. 56, No. 8, Aug. 2008, p. 1889-1898.
Aoki et al., "Distributed Active Transformer—A New Power-Combining and Impedance-Transformation Technique", IEEE Transactions on Microwave Theory and Techniques, vol. 50, No. 1, Jan. 2002, p. 316-331.
Martin et al., "An Eight-Device Extended-Resonance Power-Combining Amplifier", IEEE Transactions on Microwave Theory and Techniques, vol. 46, No. 6, Jun. 1998, p. 844-850.

(Continued)

*Primary Examiner* — Khanh V Nguyen
(74) *Attorney, Agent, or Firm* — Daly, Crowley, Mofford & Durkee, LLP

(57) ABSTRACT

An amplifier having an input transmission network with a plurality of input transformers having serially coupled primary windings. Each one of the input transformers has a secondary winding magnetically coupled to a corresponding one of the primary windings. The amplifier includes an output transmission network having a plurality of output transformers having serially coupled secondary windings. Each one of the output transformers has a secondary winding magnetically coupled to a corresponding one of the primary windings. The amplifier includes a plurality of amplifier sections, each one the sections having an input connected to a corresponding one of the secondary windings of the input transformers and an output connected to a corresponding one of the primary windings of the output transformers. The input and output transmission networks are arranged to combine signals passing from an input to the input transmission network through the plurality of amplifier sections combine in-phase at an output of the output transmission section.

21 Claims, 6 Drawing Sheets

OTHER PUBLICATIONS

Liu, "Fully Integrated CMOS Power Amplifier", Electrical Engineering and Computer Sciences University of California at Berkeley, Technical Report No. UCB/EECS-2006-162. http://www.eecs.berkeley.edu/Pubs/TechRpts/2006/EECS-2006-162.html, Dec. 6, 2006.

Notification of Transmittal of the International Search Report and the Written Opinion of the International Searching Authority, or the Declaration, PCT/US2011/055195 date of mailing Nov. 17, 2011, 4 pages.

Written Opinion of the International Searching Authority, PCT/US2011/055195 date of mailing Nov. 17, 2011, 6 pages.

* cited by examiner

TRANSFORMER COUPLED DISTRIBUTED AMPLIFIER

TECHNICAL FIELD

This disclosure relates generally to wideband, high-power and more particularly to distributed amplifiers

BACKGROUND

As is known in the art, there is a desire for wideband, high-power (>25 dBm) silicon based amplifiers in microwave systems. However, high-speed silicon-based technologies typically incorporate CMOS or HBT devices with modest breakdown voltage levels (BVCEO <4 V), which results in high operating currents in the amplifier core. These high dc and ac currents used in the amplifier core require large width metal routing to satisfy electromigration concerns and result in lossy passive structures. The ability to distribute the dc current amongst various amplifier stages and de-couple the dc amplifier current from the ac output current enables wideband, high output power silicon-based amplifier designs As is also known in the art, there are numerous circuit topologies used in silicon-based power amplifiers. Most designs consist of a cascode structure, using bipolar, silicon-germanium heterojunction bipolar, or CMOS transistors for the transistors, with standard L-C matching structures to deliver the maximum output power for a given source and load impedance as shown in FIG. 1. Depending on the application, packaging, and system requirements, the design can be single-ended or differential, with various biasing schemes (i.e. class A, AB, B, E, F, etc.) for the desired linearity, efficiency, and gain. In all of these design topologies the circuit is relatively narrowband, due to the resonant behavior of the matching structures.

As is also known in the art, distributed amplifiers have been shown in silicon technologies, but are generally designed in a single-ended fashion. Distributed amplifiers increase the gain-bandwidth product of a given amplifier stage by connecting several amplifier stages in series via transmission line elements. The design can also be realized by using discrete inductor and capacitors to act as artificial transmission line elements, as seen in FIG. 2. The signal propagates down the input of the distributed amplifier, being amplified by each discrete transistor, until it reaches the termination resistor. The output of each discrete transistor will then be combined in the collector output network (assuming the phase velocities of the input and output L-C networks are identical) to create the final broadband output.

These designs achieve a wideband of operation, but at modest output power levels (~20 dBm) over the band of operation. This output power limitation is typically due to the implementation of these amplifiers, where all of the output current (or collector current) must flow through each matching inductor. This current includes the dc current for each device, resulting in significantly high dc current flowing through the inductors located near the output. In order to accommodate this large dc current, the inductors near the output must be very wide to avoid electromigration concerns. Obviously a dc blocking capacitor could be inserted between the stages, but this would then require an additional biasing inductor at the collector of each stage, which would also degrade the circuit's performance.

As is also known in the art, the use of incorporating transformer coupled silicon-base power amplifiers has also been demonstrated in numerous works, where the output match of several amplifiers is combined via transformer elements on the silicon die. Transformer coupled amplifiers, or amplifiers having spatially distributed transformers, use monolithic transformer structures (typically intertwined inductors) to combine the output of several discrete amplifiers, as shown in FIG. 3. In this case, the input signal is split evenly amongst the amplifying transistors, with each transistor receiving the same phase and amplitude. The output of each transistor will also have the same magnitude and phase, allowing them to be summed coherently. This summation of signals will result in a higher output power for the entire amplifier than what could be achieved with a single amplifying element.

Although this topology does enable higher output power, it still maintains a narrow band frequency response. Since all of the inputs and output of the circuit are in-phase and have identical matching structures, the narrow-band shape of the transfer function will also be identical resulting in an overall narrow band response.

Further, the concept of incorporating transformer coupled silicon-base power amplifiers has also been demonstrated in numerous works: P. Haldi, D. Chowdhury, P. Reynaert, L. Gang, and A. Niknejad, "A 5.8 GHz 1 V Linear Power Amplifier Using a Novel On-Chip Transformer Power Combiner in Standard 90 nm CMOS," *IEEE Journal of Solid State Circuits*, vol. 43, no. 5, pp. 1054-1063, May 2008; I. Aoki, S. D. Kee, D. B Rutledge, and A. Hajimiri, "Distributed active transformer-a new power-combining and impedance-transformation technique," *IEEE Transactions on Microwave Theory and Techniques*, Vol. 50, pp. 316-331, January 2002 where the output match of several amplifiers is combined via transformer elements on the silicon die. Although this topology does enable higher output power, it still maintains a narrow band frequency response. Since all of the inputs and output of the circuit are in-phase and have identical matching structures, the narrow-band shape of the transfer function will also be identical resulting in an overall narrow band response.

Distributed amplifiers have also been shown in silicon technologies, but are generally designed in a single-ended fashion, as demonstrated in B. Sewiolo, D. Kissinger, G. Fischer, and R. Weigel, "A High-Gain High-Linearity Distributed Amplifier for Ultra-Wideband-Applications Using a Low Cost SiGe BiCMOS Technology," *IEEE 10th Annual Wireless and Microwave Technology Conference*, 2009, pp. 1-4, 2009. These designs achieve a wideband of operation, but at modest output power levels (~20 dBm) over the band of operation. This output power limitation is typically due to the implementation of these amplifiers. As seen in FIG. 2, all of the output current (or collector current) must flow through each matching inductor. This current includes the dc current for each device, resulting in significantly high dc current flowing through the inductors located near the output. In order to accommodate this large dc current, the inductors near the output must be very wide to avoid electromigration concerns. Obviously a dc blocking capacitor could be inserted between the stages, but this would then require an additional biasing inductor at the collector of each stage, which would also degrade the circuit's performance.

SUMMARY

In one embodiment, an amplifier is provided having an input transmission line network and an output transmission line network. The output transmission line network comprises a plurality of output transformers having serially coupled secondary windings, each one of the output transformers having a primary winding, each one of the secondary windings of the output transformers being magnetically coupled to a corresponding one of the primary windings of the output transformers. The amplifier includes a plurality of amplifier sections, each one of the sections having an input connected to the input transmission line section and having an output connected to a corresponding one of the primary windings of the output transformers. The input transmission line network and the output transmission line network are arranged to combine signals passing from an input to the input transmission line network through the plurality of amplifier sections in-phase at an output of the output transmission line section.

In one embodiment, the input transmission line section comprising a plurality of input transformers having serially coupled primary windings, each one of the input transformers having a secondary winding, each one of the secondary windings of the input transformers being magnetically coupled to a corresponding one of the primary windings of the input transformers. Each one of the amplifier sections has an input connected to a corresponding one of the secondary windings of the input transformers, In one embodiment, the amplifier in each one of the amplifier sections includes a transistor circuit having a voltage source, such voltage source being connected to primary transformer winding of the output transmission line network.

In one embodiment, the amplifier in each one of the amplifier sections includes a transistor circuit having a bias voltage supplied by the voltage source to the connected secondary transformer winding of the input transmission line network.

In one embodiment the amplifiers are differential pair transconductance amplifiers.

In one embodiment the transistors are bipolar transistors.

With such arrangement, the amplifier sections are arranged in a distributed fashion, via transformers (typically monolithically formed). In one embodiment the amplifier section included differential bipolar transistor pairs. The use of differential, center-tapped transformer winding at the output of each differential pair enables the output of each collector electrode to be incorporated in a distributed fashion while providing a method for separate dc biasing. The ability to de-couple the ac and dc collector electrode currents allows for more manageable metal width requirements for the passives incorporated in the circuit. This then allows for more optimally designed inductors (i.e., transformer windings) with lower loss. The distributed fashion of the amplifier sections circuit also allows for more manageable matching impedances for the amplifier sections. The input of the amplifier can be implemented in the traditional series inductance configuration (similar to what is shown in FIG. 2) with the output transmission line section having the secondary windings of the output transformers or with a transformer coupled approach; similar to what is being done at the output of the amplifier. The use of the transformer coupled approach at the input of the amplifier allows the dc bias of each amplifier stage to be provided via the center tap of the input transformer. This approach allows for independent biasing of each amplifier stage and eliminates dc-biasing distribution concerns, such as parasitic IR drop occurring through the distribution network at the input.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 4:
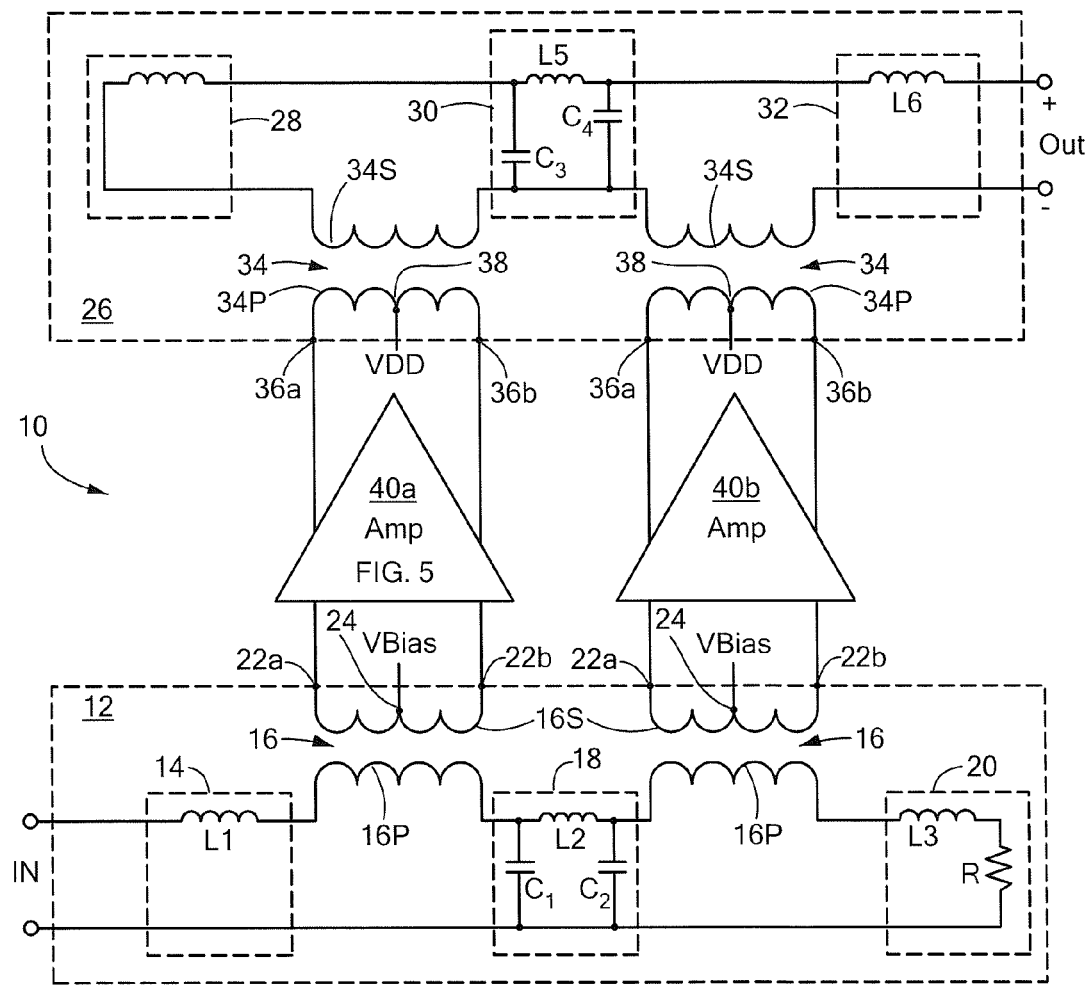
FIG. 4 is a schematic diagram of a transformer coupled distributed amplifier according to one embodiment.

Referring now to FIG. 4, an amplifier 10 is shown having an input transmission line network 12 comprising a plurality of input transformers 16 having serially coupled primary windings 16P, each one of the input transformers 16 having a secondary winding 16S. Each one of the secondary windings 16S is magnetically coupled to a corresponding one of the primary windings 16P of the input transformers. The amplifier 10 includes an output transmission line network 30 comprising a plurality of output transformers 34 having serially coupled secondary windings 34S, each one of the output transformers 34 having a primary winding 34P. Each one of the secondary windings 34S of the output transformers 34 is magnetically coupled to a corresponding one of the primary windings 34P of the output transformers 34. The amplifier 10 includes a plurality of amplifier sections 40a, 40b, each one the sections 40a, 40b having an input connected to a corresponding one of the secondary windings 16S of the input transformers 16 and having an output connected to a corresponding one of the primary windings 34P of the output transformers 34.

The input transmission line network 12 and the output transmission line network 26 are arranged to combine signals passing from an input IN to the input transmission line network 12 through the plurality of amplifier sections 40a, 40b combine in-phase at an output OUT of the output transmission line section 26.

More particularly, the amplifier 10 is shown having: an input transmission line network 12, here a lumped parameter artificial transmission line comprising: an input impedance matching network 14, here for example a series inductor L1, a plurality of serially coupled transformers 16 interconnected through a inductor-capacitor (L-C) network 18, here for example, a pi network having a pair of shunt capacitors C1, C2 interconnected through an inductor L2, and output impedance matching network 20, here a series inductor L3, and terminating resistor R1.

Each one of the transformers 16 includes a primary transformer windings 16P and a magnetically coupled secondary winding 16S. It is noted that the primary windings 16P of transformers 16 are interconnected through network 18, as shown. The secondary windings 16S have a pair of end winding taps 22a, 22b and a center tap 24 (it being understood that the center tap 24 need not be in the exact center of the winding 16S).

The amplifier 10 includes an output transmission line network 26, here a lumped parameter artificial transmission line comprising: an impedance matching network 28, here for example a series inductor L4, and a plurality of serially coupled transformers 34 interconnected through a inductor-capacitor (L-C) network 30, here for example, a pi network having a pair of shunt capacitors C3, C4 interconnected through an inductor L5, and a network 32, here a series inductor L6 connected as shown.

Each one of the transformers 34 has a primary transformer windings 34P and a magnetically coupled secondary winding 34S. The primary windings 34P has a pair of end winding taps 34a, 34b and a center tap 38 (it being understood that the center tap 38 need not be in the exact center of the winding 34P).

The amplifier 10 includes a plurality of, here for example, two, amplifier sections 40a. 40b. Each one the amplifier sections 40a, 40b comprises a transconductance amplifier shown in more detail in FIG. 5 for exemplary amplifier 40a. The input of the amplifier 40a is connected to the end taps 22a, 22b of the secondary winding 16S of a corresponding one of the transformers 16, as shown. The output of the amplifier 40a is connected to the end taps 34a, 34b of the primary winding 34P of a corresponding one of the transformers 34, as shown. The input transmission line network 12 and the output transmission line network 26 are arranged to combine signals passing from an input IN to the input transmission line network 12 through the plurality of amplifier sections 40a, 40b combine in-phase at an amplifier 10 output OUT of the output transmission line section 26. Thus, signals passing along path P1 from IN through amplifier section 40a to amplifier 10 output OUT and signals passing along path P2 from IN through amplifier section 40b to OUT are in-phase at the amplifier 10 output OUT.

It is noted that the network 18 and network 30 are acting as the distributed amplifier delay elements between the two amplifier sections 40a, 40b, and the other networks 14, 20, 28 and 32 are primarily used for impedance matching. It is also noted that phase delays must be take into consideration in the transformers with their have inherent parasitic series inductances as well as the parasitics of the transistors themselves.

It is also noted that the amplifier sections 40a, 40b includes a transistor circuit having a bias voltage Vbias supplied by a sources Vdd connected to the center tap 24 of the primary winding of the output transformer 34. Here, for example, the amplifier is a differential pair transconductance amplifier and the transistors are bipolar transistors. Thus, the amplifiers 40a, 40b include a pair of transistors T1, T2 having base electrodes connected to the end taps 22a, 22b, respectively and having grounded emitter electrodes. The collector electrodes are connected to the emitter electrodes of transistors T3 and T4 respectively, as shown. The collector electrodes of transistors T3, T4 are connected to the center taps 34a, 34b, respectively, as shown.

Figure 6:
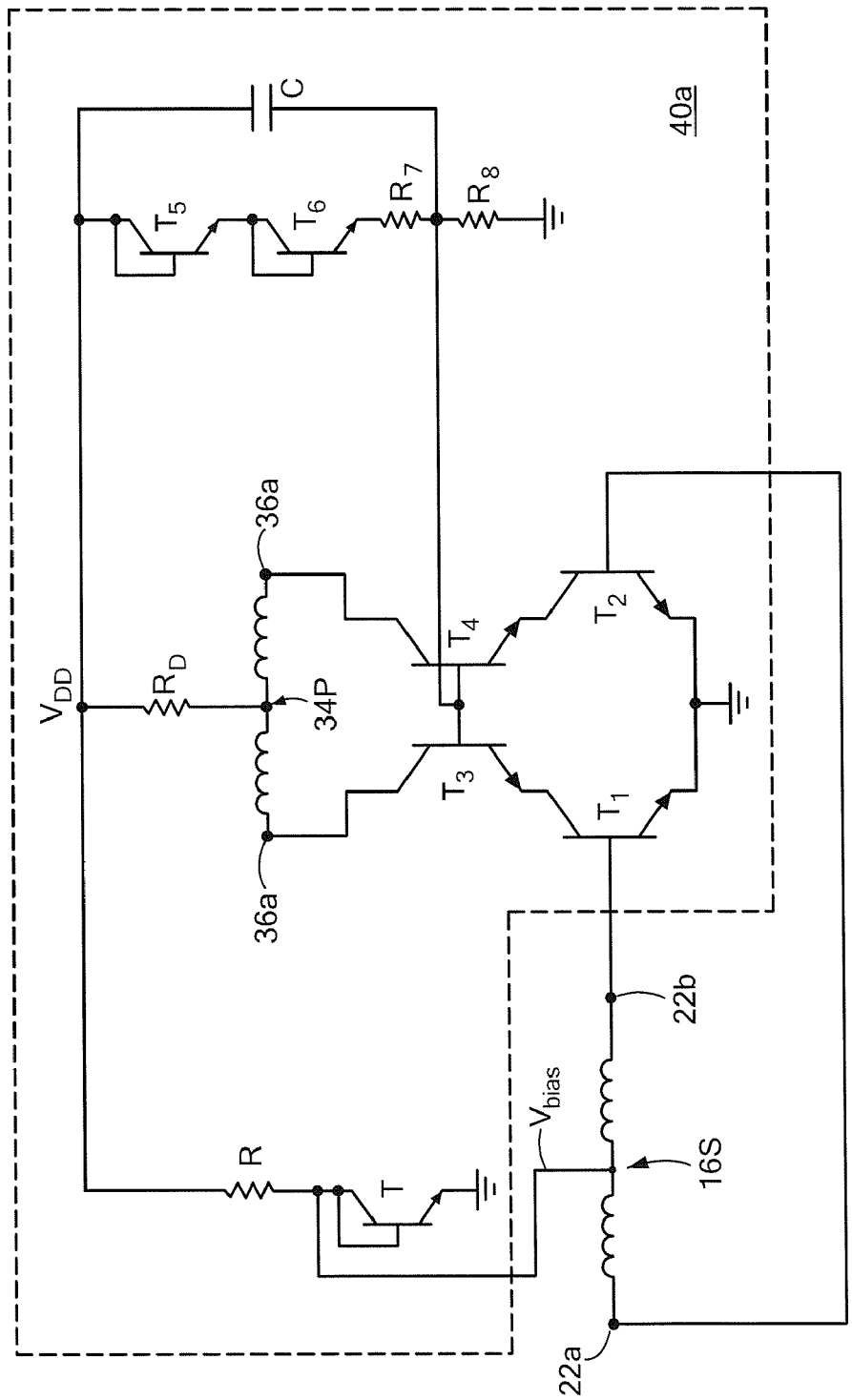
FIG. 6 shows the exemplary amplifier section of FIG. 5 in more detail.

Referring to FIG. 6, it is noted that the voltage source Vdd is connected to the center tap 38 of the primary windings 34P of the output transformer 34 and is also connected to a resistor R. The resister R is connected to a diode connected transistor T as shown to produce the bias voltage Vbias. The generated bias voltage Vbias is connected to the center tap of the secondary winding 16S of the input transformers 16, as indicated. The ends 22a, 22b of the secondary winding 16S of the input transformers 16 are connected to the base electrodes of transistors T1 and T2.

The use of differential, center-tapped inductor based transformers 34 at the output of each differential pair of transistors T3, T4 enables the output of each collector electrodes to be incorporated in a distributed fashion while providing a method for separate dc biasing. The ability to de-couple the ac and dc collector currents allows for more manageable metal width requirements for conventional passive components, not shown, incorporated in the amplifiers 40a, 40b. This then allows for more optimally designed inductors with lower loss.

The distributed fashion of the amplifier 10 also allows for more manageable matching impedances for the amplifiers 40a, 40b.

Figure 1:
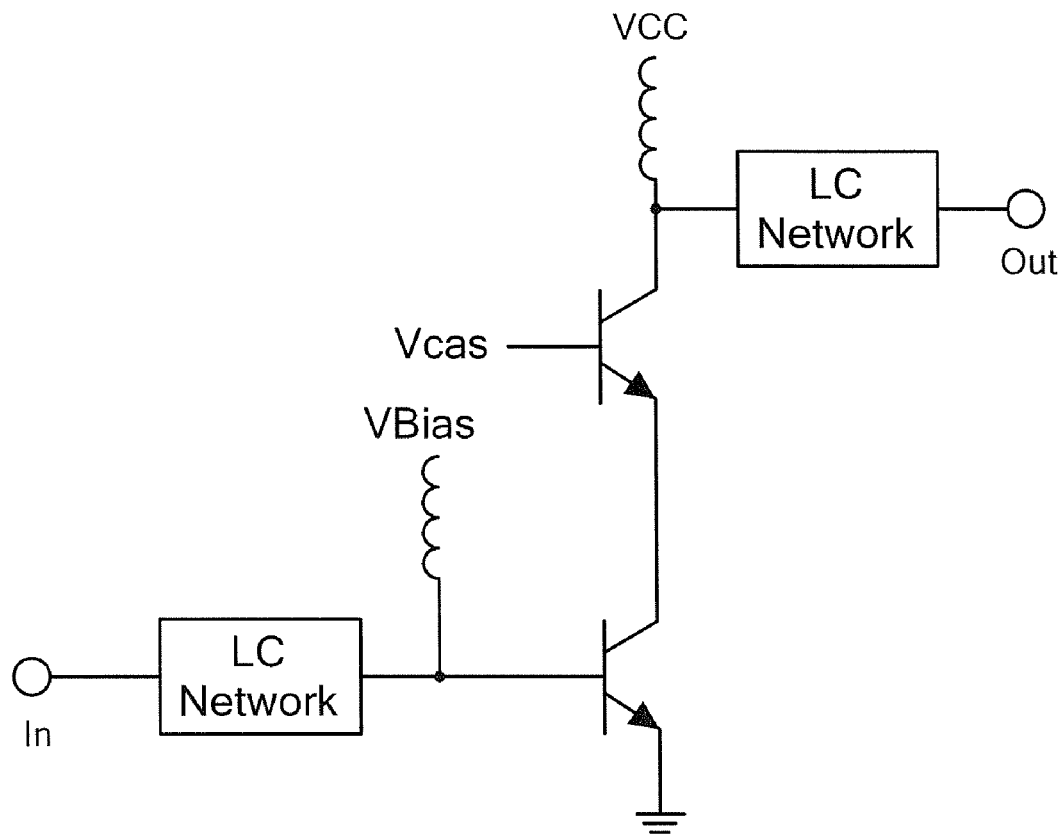
FIG. 1 is a schematic diagram of a cascode silicon based power amplifier according to the PRIOR ART.
Figure 2:
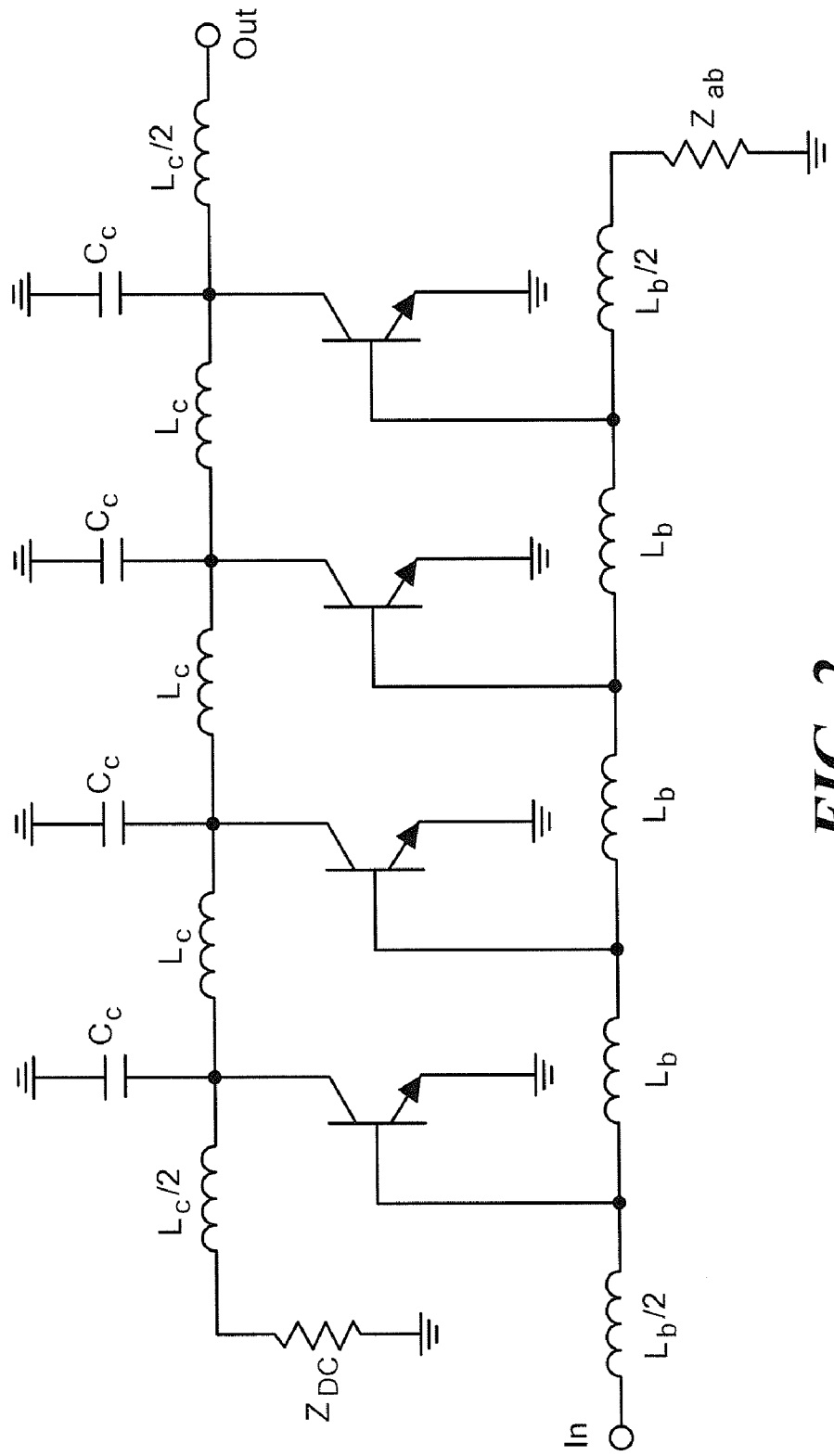
FIG. 2 is a schematic diagram of a four-element distributed amplifier based on discrete transistors according to the PRIOR ART.
Figure 3:
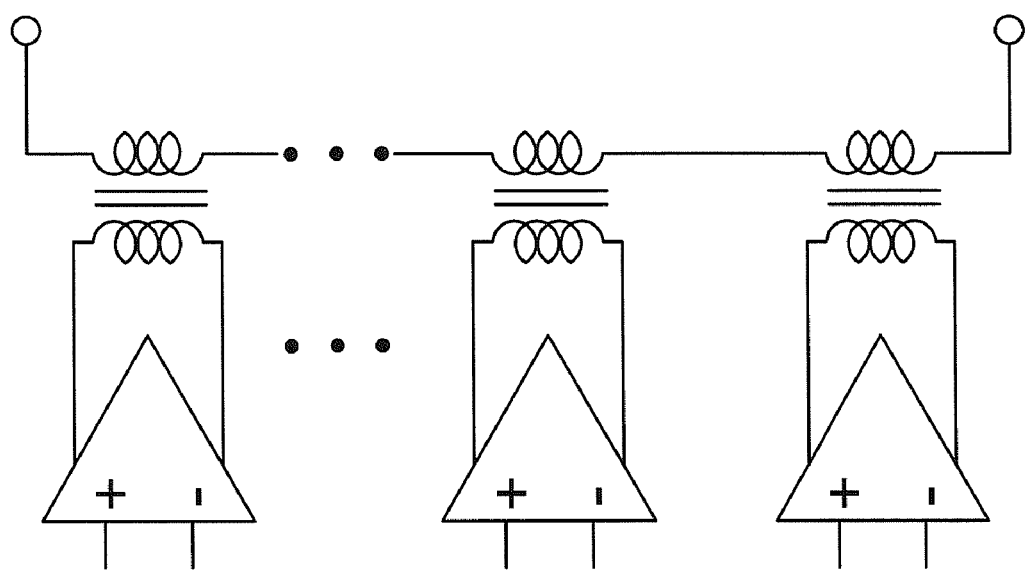
FIG. 3 is a schematic diagram of a series-connected transformer coupled amplifier according to an embodiment according to the PRIOR ART.
Figure 5:
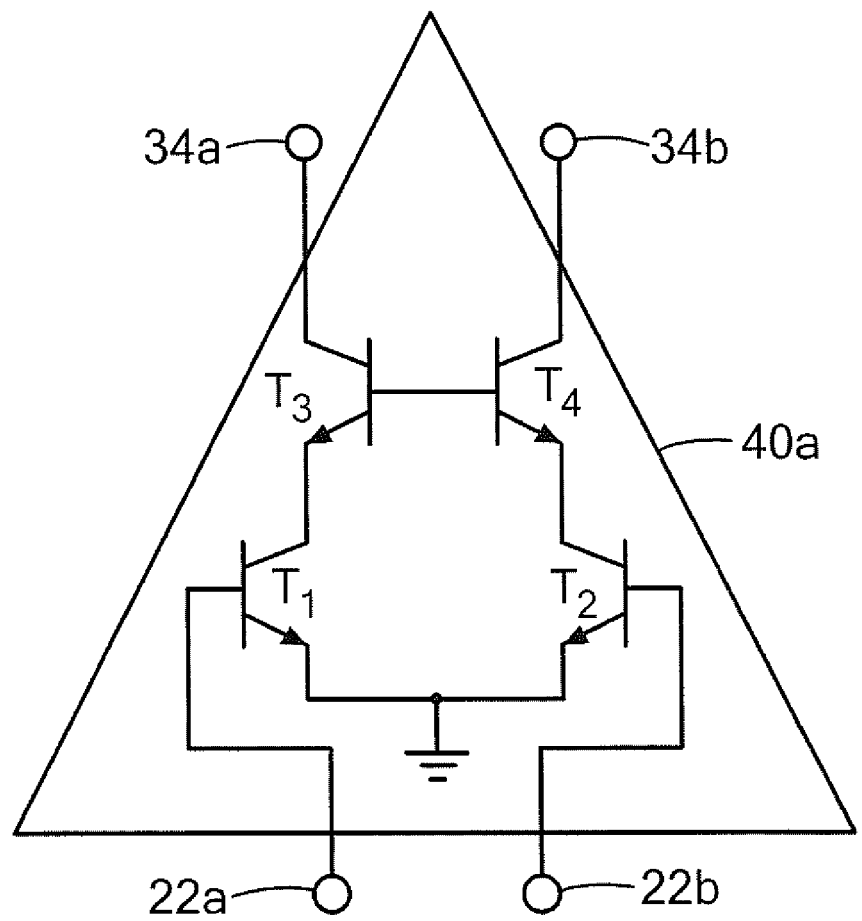
FIG. 5 is a schematic diagram of an exemplary one of amplifier sections used in the amplifier of FIG. 4.

The input of the circuit can be implemented in the traditional series inductance configuration, or (as shown in FIG. 5) rather than with input transformers, but rather with a distributed transmission line as shown for the input network used for the amplifier of FIG. 2. It is noted that using the input transformers as in FIG. 4 allows the dc bias of each amplifier section to be provided via the center tap of the input transformers. This approach allows for independent biasing of each amplifier section and eliminates dc-biasing distribution concerns, such as parasitic current-resister (IR) voltage drop occurring through the distribution network at the input.

Thus, having the transformers on the input bias Vbias helps simplify the input bias for the transistors T1-T2. For any bipolar amplifier, the input bias Vbias will need to provide a base current for the transistors T1 and T2. Referring again to FIG. 6, this input bias base current from Vbias will increase with input power (especially for a compressed amplifier or class AB amplifier), which is why a low impedance bias circuit is used, as opposed to a high impedance bias circuit (i.e. a current bias) for the bias voltage Vbias. A similar low-impedance voltage reference circuit having diode connected transistors T5 and T6, resistors R7 and R8 and dc blocking capacitor C is used to provide the bias base current for transistors T3 and T4. The main difference is that the base electrodes of transistors T3 and T4 are actually virtual grounds (since a differential circuit is used) and can be connected to this bias circuit directly (this is different than transistors T1 and T2, where the transformer is to allow us to bias the base electrodes). It is noted that the voltage source Vdd connected to the center tap of the center tapped primary winding 36b of the output transformer 36 is used to generate Vbias through resistor R and diode connected transistor T. The produced Vbias is at the junction of the resistor R and the diode connected transistor T. If this voltage bias (or one similar to it) were placed directly at the bases of transistors T1 and T2, without the inclusion of the input transformer network, the signal would be lost and a dc-choke inductor would be required between the base of transistors T1 and T2 and voltage bias circuit. Further, a dc-blocking capacitor would typically be required at the RF input to ac-couple the input signal. Here, however, the second winding 16S of input transformer 16 is connected to the voltage reference circuit which generates Vbias and the desired RF signal is ac-coupled via the input transformer. Since this center tap of the input transformer 16 is in the "common-mode" of the amplifier (or it's virtual ground), Vbias can be connected directly to it without the requirement of a choke inductor. By using the input transformers in the input transmission line network the signal is coupled directly into the amplifier sections and an independent dc bias can be applied to the amplifier sections.

A number of embodiments of the disclosure have been described. Nevertheless, it will be understood that various modifications may be made without departing from the spirit and scope of the disclosure. For example, more than two amplifiers may be used. Accordingly, other embodiments are within the scope of the following claims.

What is claimed is:
1. An amplifier, comprising:
an input transmission line network having:
an input transmission line delay element disposed between a first portion of the input transmission line network and a second portion of the input transmission line network;

a plurality of input transformers having primary windings coupled serially coupled through the input transmission line delay element, each one of the input transformers having a primary winding and a secondary windings magnetically coupled to a primary windings of the input transformer;

an output transmission line network having:
an output transmission line delay element disposed between a first portion of the output transmission line network and a second portion of the output transmission line network;
a plurality of output transformers having secondary windings serially coupled through the output transmission line delay element, each one of the output transformers having a primary winding magnetically coupled to a corresponding one of the secondary windings of the output transformer;

a plurality of amplifier sections, each one of the amplifier sections having an input connected to the secondary winding of a corresponding one of the input transformers and having an output connected to a corresponding one of the primary windings of the output transformers, and wherein the input transmission line network and the output transmission line network are arranged to combine signals passing from an input to the input transmission line network through the plurality of amplifier sections combine in-phase at an output of the output transmission line section.

2. The amplifier recited in claim 1, wherein the input transmission line network terminates in an output impedance matching network.

3. The amplifier recited in claim 1, wherein each one of the amplifier sections includes a transistor circuit having a bias voltage supplied by a voltage source connected to the connected primary winding of the output transformers of the output transmission line network.

4. The amplifier recited in claim 3, wherein the voltage source is connected to a center tap of the primary winding of the output transformers of the output transmission line network.

5. The amplifier recited in claim 4, wherein the input transmission line network comprises a plurality of input transformers having serially coupled primary windings, each one of the input transformers having a secondary winding, each one of the secondary windings of the input transformers being magnetically coupled to a primary winding of a corresponding one of input transformers, each one of the amplifier sections has an input connected to a corresponding one of the secondary windings of the input transformers.

6. The amplifier recited in claim 5, wherein each one of the amplifier sections includes a transistor circuit having a bias voltage supplied by a voltage source connected to the connected primary winding of the output transformers of the output transmission line network.

7. The amplifier recited in claim 6, wherein the voltage source is connected to a center tap of the primary winding of the output transformers of the output transmission line network.

8. The amplifier recited in claim 6, wherein one of the amplifier sections includes a transistor circuit having a bias voltage supplied by a voltage source connected to the connected primary winding of the output transformers of the output transmission line network.

9. The amplifier recited in claim 1, wherein the amplifier is a differential pair transconductance amplifier.

10. The amplifier recited in claim 9, wherein the amplifier includes bipolar transistors.

11. The amplifier recited in claim 2, wherein the amplifier is a differential pair transconductance amplifier.

12. The amplifier recited in claim 11, wherein the amplifier includes transistors.

13. The amplifier recited in claim 1, wherein the output transmission line network includes an impedance matching network.

14. The amplifier recited in claim 1, wherein the input transmission line delay element is a lumped element.

15. The amplifier recited in claim 1, wherein the output transmission line delay element is a lumped element.

16. The amplifier recited in claim 15, wherein the input transmission line delay element is a lumped element.

17. The amplifier recited in claim 14, wherein the lumped element is an inductor-capacitor network having a pair of shunt capacitors interconnected through an inductor.

18. The amplifier recited in claim 15, wherein the lumped element is an inductor-capacitor network having a pair of shunt capacitors interconnected through an inductor.

19. The amplifier recited in claim 16, wherein the lumped element is an inductor-capacitor network having a pair of shunt capacitors interconnected through an inductor.

20. An amplifier, comprising:
an input artificial transmission line network;
an output artificial transmission line network comprising a plurality of output transformers having serially coupled secondary windings with a delay element between the secondary windings, each one of the output transformers having a primary winding, each one of the secondary windings of the output transformers being magnetically coupled to a corresponding one of the primary windings of the output transformers;
a plurality of amplifier sections, each one of the sections having an input connected to the input artificial transmission line network and having an output connected to a corresponding one of the primary windings of the output transformers, and
wherein the input artificial transmission line network and the output artificial transmission line network are arranged to combine signals passing from an input to the input artificial transmission line network through the plurality of amplifier sections combine in-phase at an output of the output artificial transmission line section.

21. The amplifier recited in claim 20, wherein the input artificial transmission line network comprises a plurality of input transformers having serially coupled primary windings with a delay element between the primary windings, each one of the input transformers having a secondary winding, each one of the secondary windings of the input transformers being magnetically coupled to a primary winding of a corresponding one of input transformers, each one of the amplifier sections has an input connected to a corresponding one of the secondary windings of the input transformers.

* * * * *